United States Patent
Banna et al.

(10) Patent No.: US 12,342,679 B2
(45) Date of Patent: Jun. 24, 2025

(54) LIGHT EMITTING DIODES COMPRISING FIELD PLATES

(71) Applicant: Lumileds LLC, San Jose, CA (US)

(72) Inventors: Srinivasa Banna, San Jose, CA (US); Antonio Lopez-Julia, Aachen (DE); Joseph Flemish, San Jose (CA)

(73) Assignee: Lumileds LLC, San Jose, CA (US)

(*) Notice: Subject to any disclaimer, the term of this patent is extended or adjusted under 35 U.S.C. 154(b) by 485 days.

(21) Appl. No.: 17/949,071

(22) Filed: Sep. 20, 2022

(65) Prior Publication Data

US 2023/0086869 A1 Mar. 23, 2023

Related U.S. Application Data

(60) Provisional application No. 63/246,477, filed on Sep. 21, 2021.

(51) Int. Cl.
*H10K 59/12* (2023.01)
*H10H 20/814* (2025.01)
*H10H 20/851* (2025.01)

(52) U.S. Cl.
CPC .......... *H10K 59/12* (2023.02); *H10H 20/814* (2025.01); *H10H 20/8514* (2025.01)

(58) Field of Classification Search
CPC ... H10K 59/12; H10H 20/8514; H10H 20/814
See application file for complete search history.

(56) References Cited

U.S. PATENT DOCUMENTS

| | | |
|---|---|---|
| 8,969,892 B2 | 3/2015 | Lim et al. |
| 9,666,677 B1* | 5/2017 | Raring ................. H10H 20/824 |
| 2018/0062047 A1 | 3/2018 | Biwa et al. |
| 2018/0309029 A1 | 10/2018 | Kim et al. |
| 2019/0004105 A1* | 1/2019 | Henley ................. H10H 20/857 |
| 2021/0013314 A1* | 1/2021 | Hu .......................... H10D 99/00 |
| 2022/0102541 A1* | 3/2022 | Lin ...................... H10D 64/115 |

FOREIGN PATENT DOCUMENTS

| | | |
|---|---|---|
| CN | 111403566 A | 7/2020 |
| KR | 10-2012-0037266 A | 4/2012 |
| WO | 2021/119566 A1 | 6/2021 |

OTHER PUBLICATIONS

From the Korean Intellectual Property Office as the ISA, Notification of Transmittal of the International Search Report and the Written Opinion of the International Searching Authority or the Declaration, PCT/US2022/044213, Jan. 13, 2023, 12 pages.

\* cited by examiner

*Primary Examiner* — Mark W Tornow

(57) ABSTRACT

This specification discloses LEDs and LED arrays configured such that an electric field may be applied during operation of the device to drive charge carriers (electrons or holes) away from perimeter semiconductor surfaces of the LEDs, thereby reducing non-radiative recombination near those perimeter surfaces. These LEDs and LED arrays comprise (e.g., metal) field plates, arranged around the perimeter surfaces of the LEDs, by which the electric field may be applied. In some variations, the bias voltage applied to the field plates to produce the electric fields may be separately controlled for some, or each, LED in an array. In other variations the bias applied to the field plates is the same for each LED in an array.

22 Claims, 11 Drawing Sheets

LIGHT EMITTING DIODES COMPRISING FIELD PLATES

CROSS-REFERENCE TO RELATED APPLICATIONS

This application claims benefit of priority to U.S. Provisional Patent Application No. 63/246,477 filed Sep. 21, 2021, which is incorporated herein by reference in its entirety.

FIELD OF THE INVENTION

The invention relates generally to light emitting diodes (LEDs), light emitting diode arrays, light sources comprising LEDs and LED arrays, and displays comprising LEDs and LED arrays.

BACKGROUND

Inorganic LEDs have been widely used to create different types of displays, matrices and light engines including automotive adaptive headlights, augmented-reality (AR) displays, virtual-reality (VR) displays, mixed-reality (MR) displays, smart glasses and displays for mobile phones, smart watches, monitors and TVs, and flash illumination for cameras in mobile phones. The individual LED pixels in these architectures can have an area of a few square millimeters down to a few square micrometers depending on the matrix or display size and its pixel per inch requirements. These types of LED matrices/displays may for example be realized by transfer and attachment of individual pixels from a donor substrate to a controller backplane or electronic board or be created by a monolithic approach where a monolithically integrated array of LED pixels is processed into an LED module on a donor epitaxial wafer and then transferred and attached to a controller backplane.

In operation of an LED, a forward bias is applied across a diode junction in the LED and radiative recombination of injected electrons and holes results in the emission of light. In general, the desired radiative recombination process competes with non-radiative recombination processes in which injected electrons and holes recombine without emitting light. Such non-radiative recombination undesirably reduces the quantum efficiency with which the LED emits light.

Nonradiative recombination in an LED is promoted by non-radiative recombination centers (e.g., defects, dangling bonds, and surfaces states) located at or near perimeter semiconductor surfaces of the LED and resulting for example from etch damage that occurs during fabrication of the device. Because nonradiative recombination occurs primarily near device perimeter semiconductor surfaces, its undesirable effect on device quantum efficiency increases significantly as device size decreases and the surface to volume ratio of the device consequently increases. For example microLED devices, which are miniature LEDs typically of sizes<50 um×50 um, can suffer from low quantum efficiency due to increased non-radiative recombination of carriers at the device perimeter.

SUMMARY

This specification discloses LEDs and LED arrays in which an electric field is applied during operation of the device to drive charge carriers (electrons or holes) away from perimeter semiconductor surfaces of the LEDs, thereby reducing non-radiative recombination near those perimeter surfaces. These LEDs and LED arrays comprise (e.g., metal) field plates, arranged around the perimeter surfaces of the LEDs, by which the electric field may be applied. In some variations, the bias voltage applied to the field plates to produce the electric fields may be separately controlled for some, or for each, LED in an array. In other variations the bias applied to the field plates is the same for each LED in an array.

The LEDs and LED arrays disclosed herein may comprise phosphor-converted or direct-color LEDs. Individual LEDs may have light emitting surfaces having areas ranging from a few square micrometers (microLEDs) to square millimeters (conventional LEDs).

The LED arrays disclosed herein may be advantageously employed in any of the devices and applications listed above in the Background section.

The use of field plates and electric fields applied to reduce carrier populations near perimeter surfaces and thereby reduce non-radiative recombination, as disclosed herein, may be particularly advantageous for microLEDs and microLED arrays.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
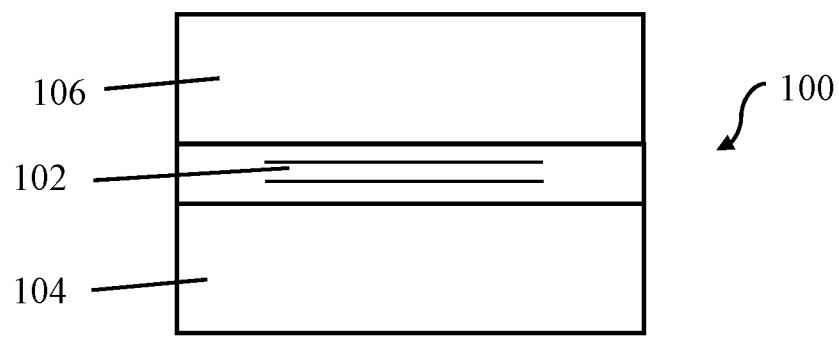
FIG. 1 shows a schematic cross-sectional view of an example phosphor converted LED (pcLED).

FIG. 1 shows an example of an individual pcLED 100 comprising a light emitting semiconductor diode (LED) structure 102 disposed on a substrate 104, and a phosphor layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits ultraviolet, blue, green, or red light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output and color specifications from the pcLED.

Figure 2A:
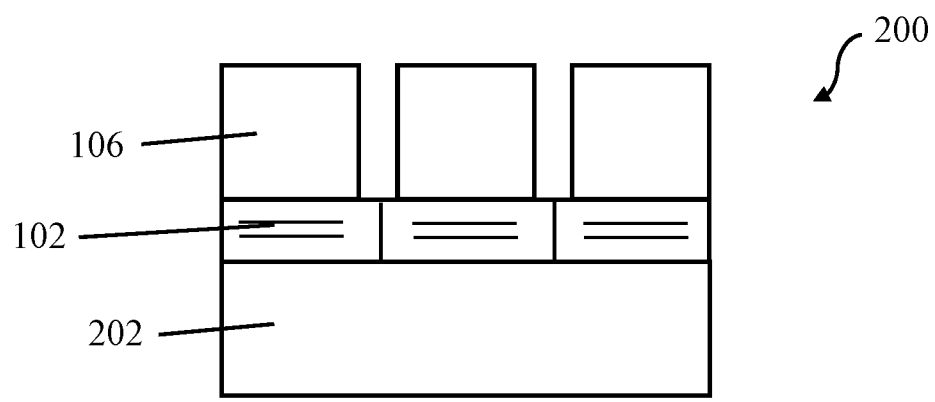
FIGS. 2A and 2B show, respectively, cross-sectional and top schematic views of an array of pcLEDs.
Figure 2B:
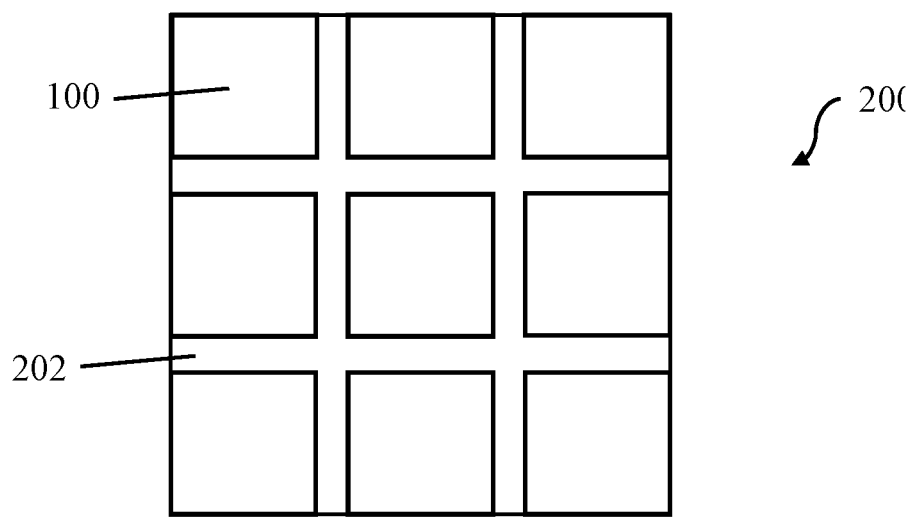

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED and may be formed from any suitable materials.

Although FIGS. 2A-2B, show a three-by-three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, less than or equal to 50 microns, or less than or equal to 10 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape or arrangement. Although the illustrated examples show an array in which all pixels are of the same size, pixels in an array may differ in size. For example, one or more central pixels may be larger than one or more peripheral pixels. Alternatively, one or more peripheral pixels may be larger than one or more central pixels. Any suitable variation of pixel size in an array may be used.

Figure 2C:
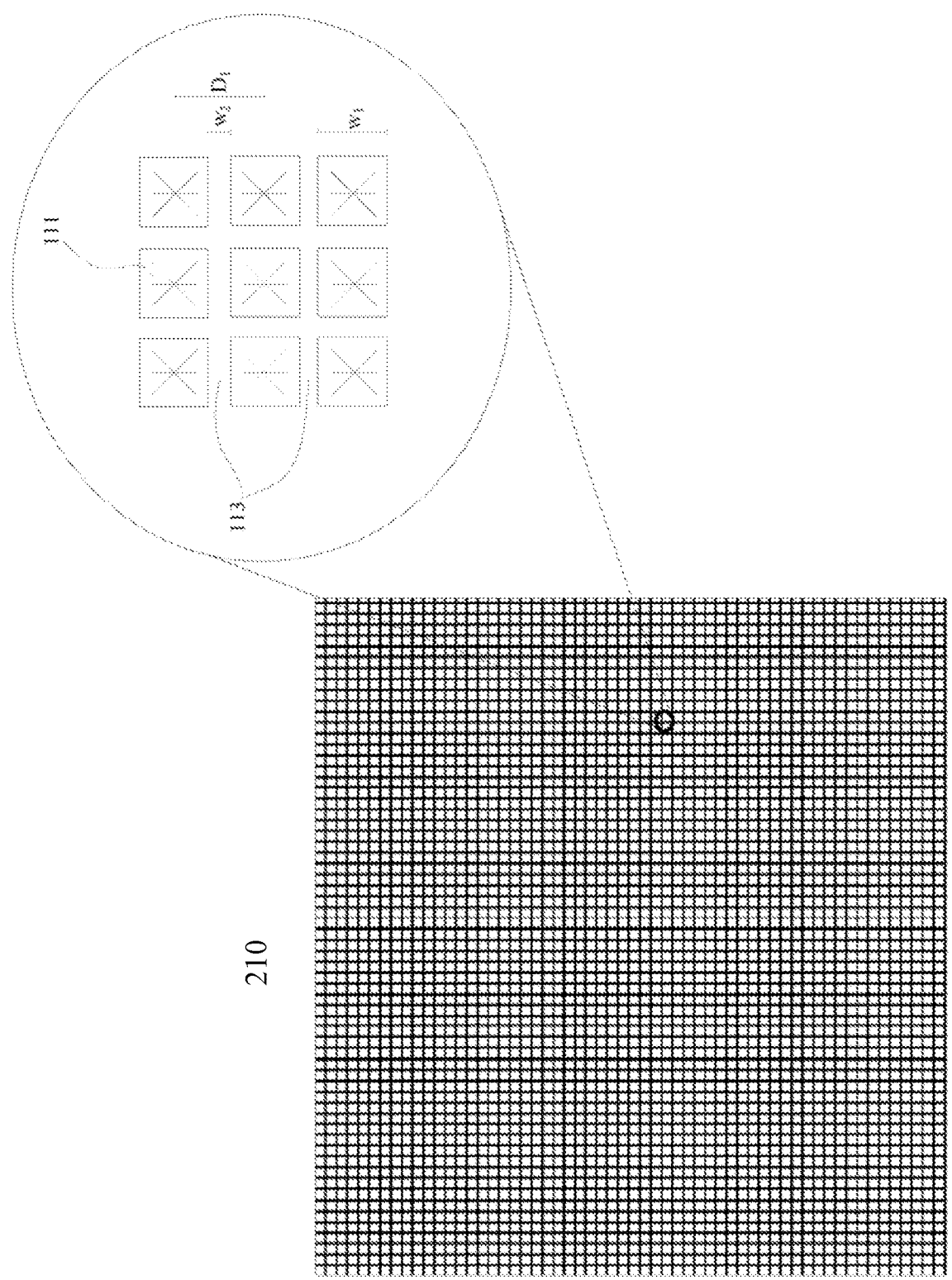
FIG. 2C shows a schematic top view of an LED wafer from which LED arrays such as those illustrated in FIGS. 2A and 2B may be formed.

FIG. 2C shows a schematic top view of a portion of an LED wafer 210 from which LED arrays such as those illustrated in FIGS. 2A and 2B may be formed. FIG. 2C also shows an enlarged 3×3 portion of the wafer. In the example wafer individual LEDs or pcLEDs 111 having side lengths (e.g., widths) of $W_1$ are arranged as a square matrix with neighboring LEDs or pcLEDs having a center-to-center distances $D_1$ and separated by lanes 113 having a width $W_2$. $W_1$ may be, for example, less than or equal to 1 millimeter (mm), less than or equal to 500 microns, less than or equal to 100 microns, less than or equal to 50 microns, or less than or equal to 10 microns. $W_2$ may be, for example, hundreds of microns, less than or equal to 100 microns, less than or equal to 50 microns, less than or equal to 10 microns, or less than or equal to 5 microns. $D_1=W_1+W_2$.

An array may be formed, for example, by dicing wafer 210 into individual LEDs or pcLEDs and arranging the dice on a substrate. Alternatively, an array may be formed from the entire wafer 210, or by dividing wafer 210 into smaller arrays of LEDs or pcLEDs.

LEDs having dimensions in the plane of the array (e.g., side lengths) of less than or equal to about 50 microns are typically referred to as microLEDs, and an array of such microLEDs may be referred to as a microLED array.

An array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure.

The individual LEDs in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 3A:
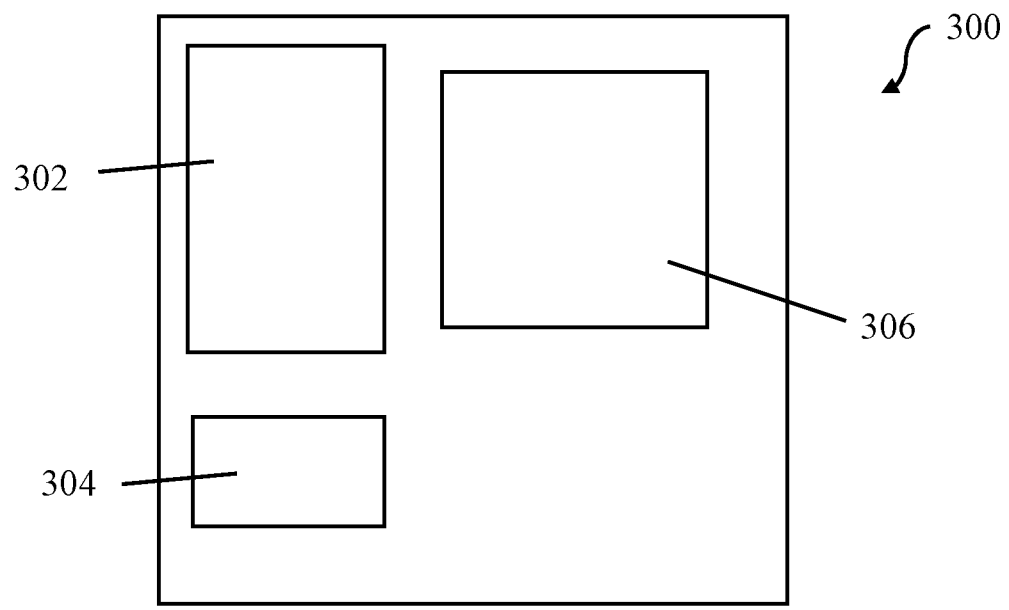
FIG. 3A shows a schematic top view of an electronics board on which an array of pcLEDs may be mounted, and FIG. 3B similarly shows an array of pcLEDs mounted on the electronic board of FIG. 3A.
Figure 3B:
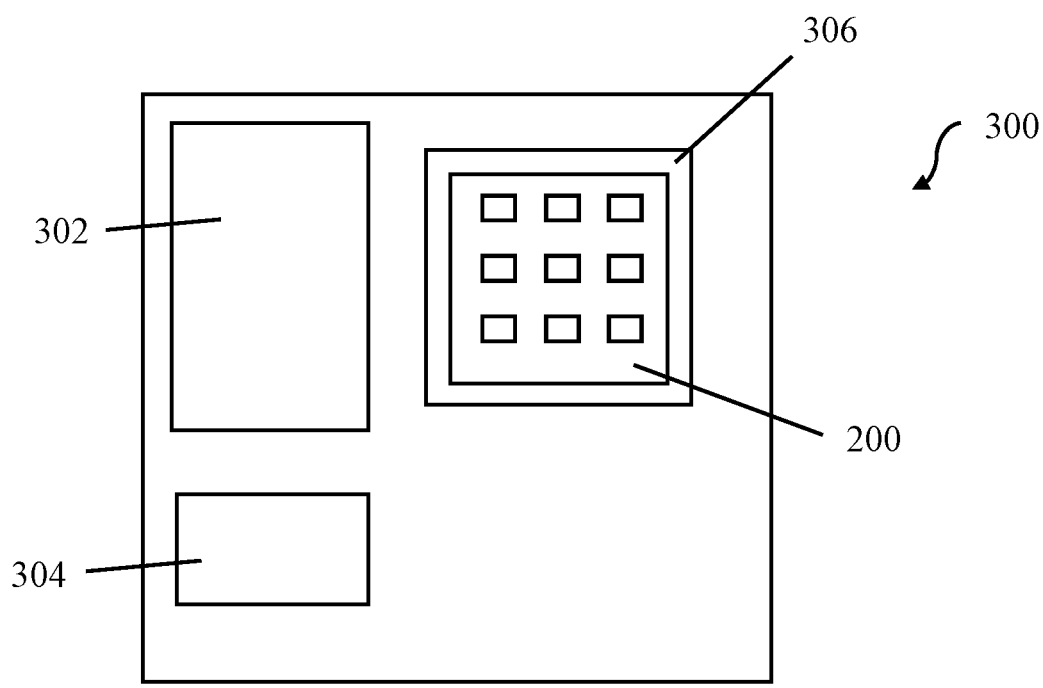

As shown in FIGS. 3A-3B, an LED or pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
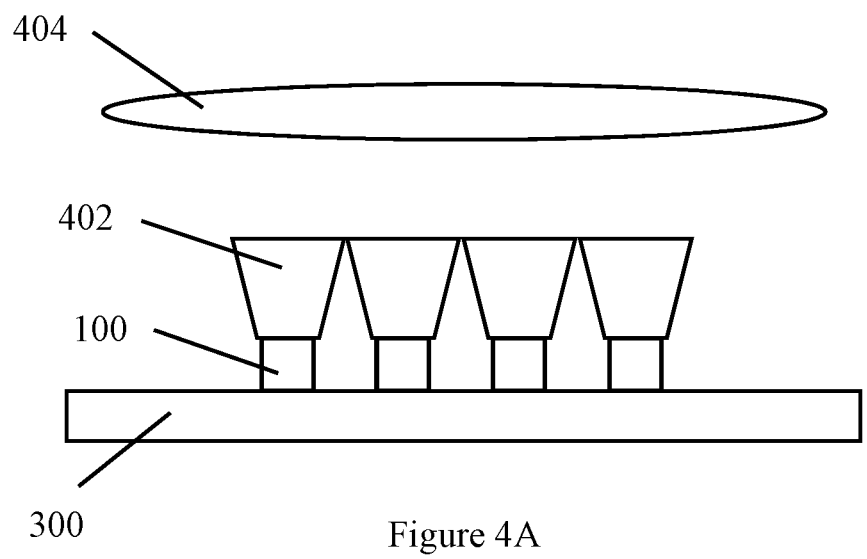
FIG. 4A shows a schematic cross-sectional view of an array of pcLEDs arranged with respect to waveguides and a projection lens.
Figure 4B:
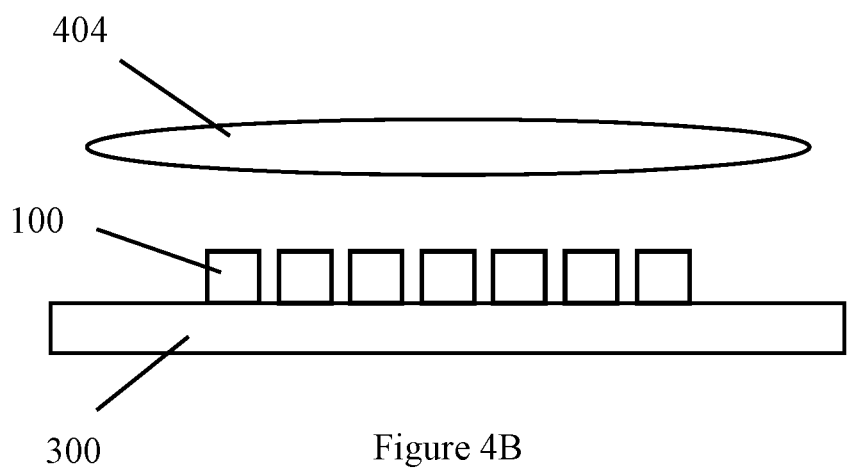
FIG. 4B shows an arrangement similar to that of FIG. 4A, without the waveguides.

Individual LEDs or pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B an array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may be particularly suitable when pcLEDs can be spaced sufficiently close to each other and may also be used in automobile headlights as well as in camera flash applications. A microLED display application may use similar optical arrangements to those depicted in FIGS. 4A-4B, for example. Generally, any suitable arrangement of optical elements may be used in combination with the LED arrays described herein, depending on the desired application.

An array of independently operable LEDs or pcLEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive, mobile device camera, VR, and AR applications.

Figure 5:
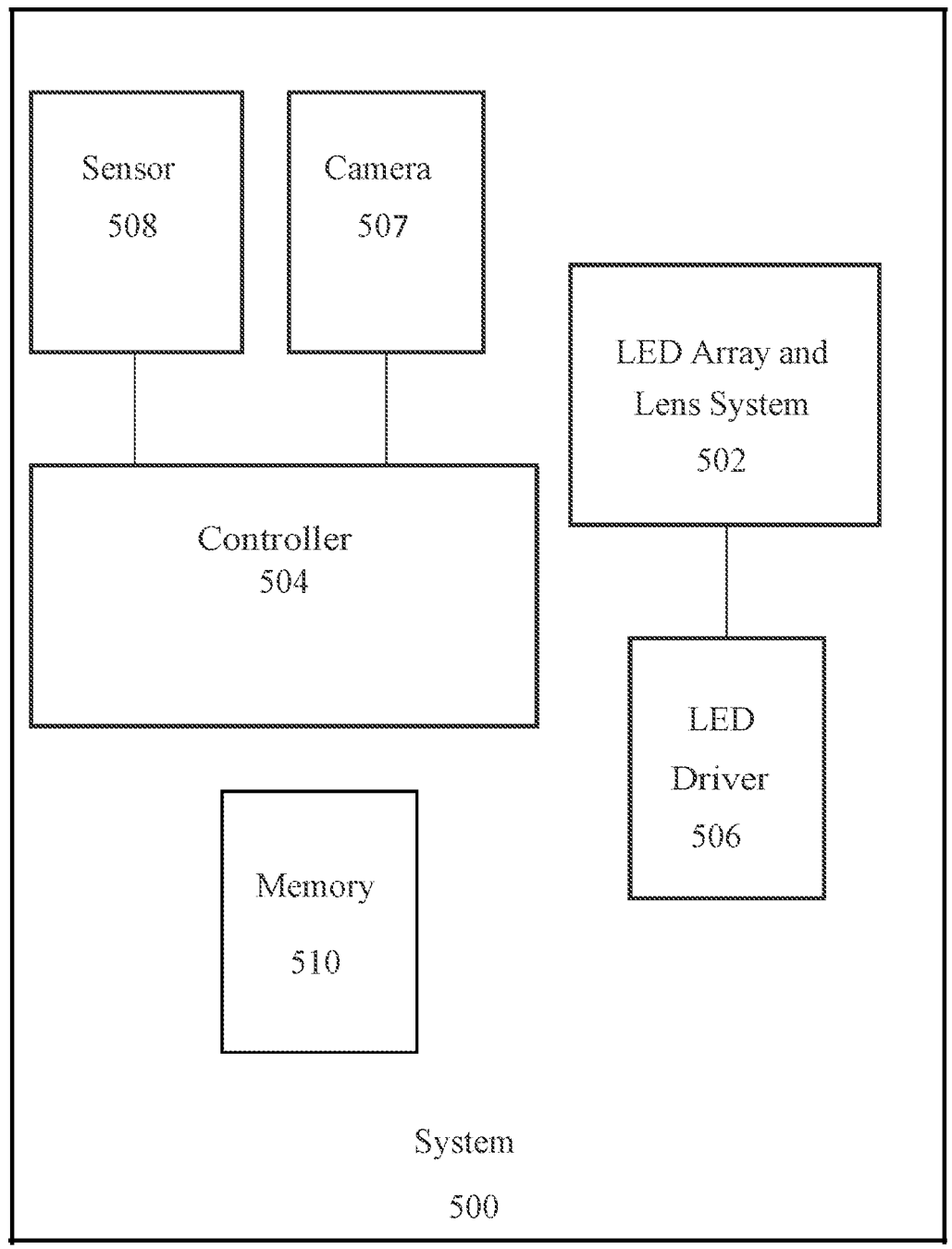
FIG. 5 schematically illustrates an example camera flash system comprising an adaptive illumination system.

FIG. 5 schematically illustrates an example camera flash system 500 comprising an LED array and lens system 502, which may be similar or identical to the systems described above. Flash system 500 also comprises an LED driver 506 that is controlled by a controller 504, such as a microprocessor. Controller 504 may also be coupled to a camera 507 and to sensors 508, and operate in accordance with instructions and profiles stored in memory 510. Camera 507 and adaptive illumination system 502 may be controlled by controller 504 to match their fields of view.

Sensors 508 may include, for example, positional sensors (e.g., a gyroscope and/or accelerometer) and/or other sensors that may be used to determine the position, speed, and orientation of system 500. The signals from the sensors 508 may be supplied to the controller 504 to be used to determine the appropriate course of action of the controller 504 (e.g., which LEDs are currently illuminating a target and which LEDs will be illuminating the target a predetermined amount of time later).

In operation, illumination from some or all pixels of the LED array in 502 may be adjusted—deactivated, operated at full intensity, or operated at an intermediate intensity. Beam focus or steering of light emitted by the LED array in 502 can be performed electronically by activating one or more subsets of the pixels, to permit dynamic adjustment of the beam shape without moving optics or changing the focus of the lens in the lighting apparatus.

Figure 6:
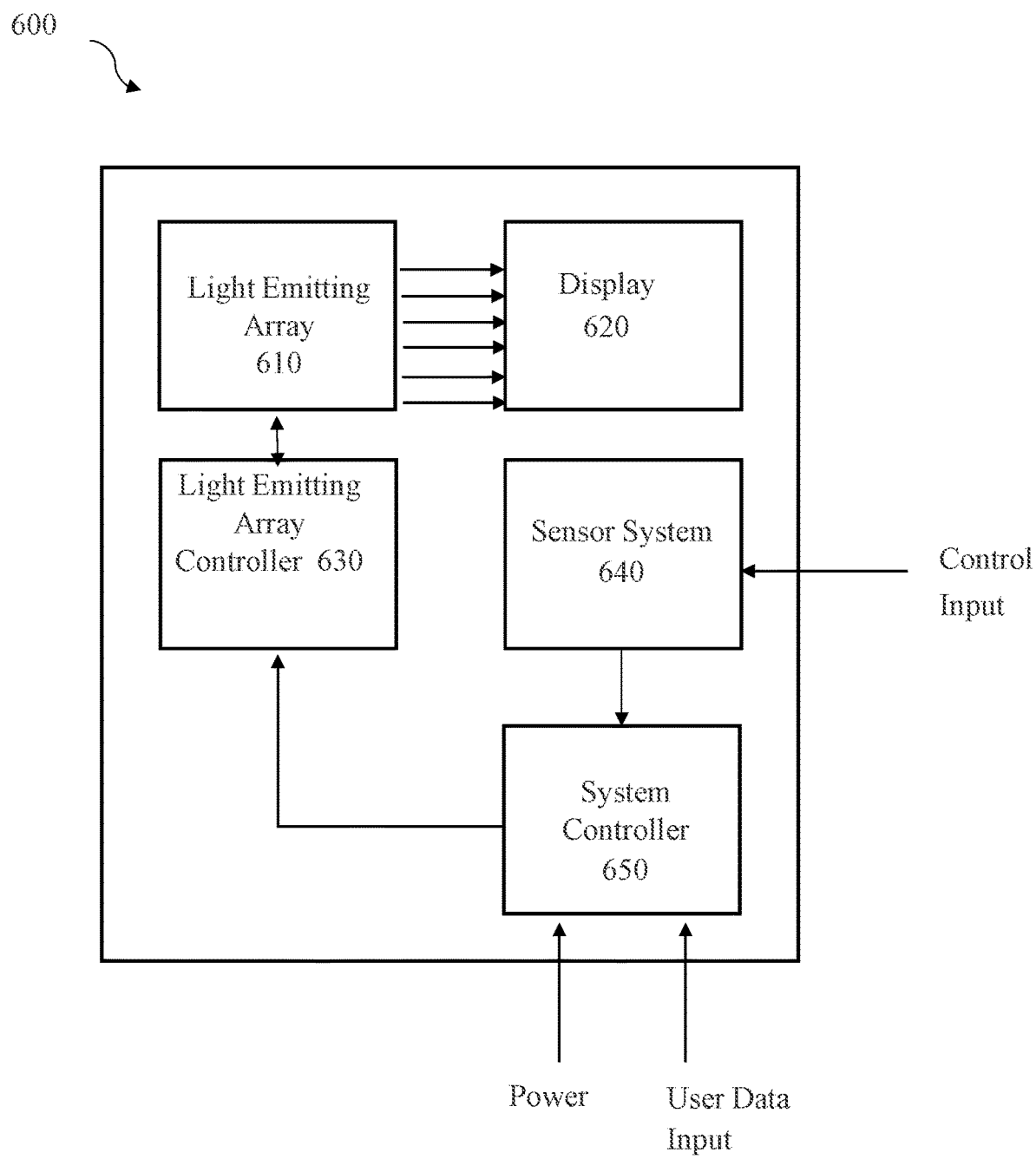
FIG. 6 schematically illustrates an example display (e.g., AR/VR/MR) system that includes an adaptive illumination system.

FIG. 6 schematically illustrates an example display (e.g., AR/VR/MR) system 600 that includes an adaptive light emitting array 610, display 620, a light emitting array controller 630, sensor system 640, and system controller 650. Control input is provided to the sensor system 640, while power and user data input is provided to the system controller 650. In some embodiments modules included in system 600 can be compactly arranged in a single structure, or one or more elements can be separately mounted and connected via wireless or wired communication. For example, the light emitting array 610, display 620, and sensor system 640 can be mounted on a headset or glasses, with the light emitting controller and/or system controller 650 separately mounted.

The light emitting array 610 may include one or more adaptive light emitting arrays, as described above, for example, that can be used to project light in graphical or object patterns that can support AR/VR/MR systems. In some embodiments, arrays of microLEDs can be used.

System 600 can incorporate a wide range of optics in adaptive light emitting array 610 and/or display 620, for example to couple light emitted by adaptive light emitting array 610 into display 620.

Sensor system 640 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 640, system controller 650 can send images or instructions to the light emitting array controller 630. Changes or modification to the images or instructions can also be made by user data input, or automated data input as needed. User data input can include but is not limited to that provided by audio instructions, haptic feedback, eye or pupil positioning, or connected keyboard, mouse, or game controller.

As summarized above, this specification discloses LEDs and LED arrays comprising field plates by which an electric field may be applied during operation of the device to reduce carrier populations near perimeter semiconductor surfaces of the device at which non-radiative recombination may occur. This reduces the non-radiative recombination rate and thus improves the quantum efficiency of the device.

Figure 7A:
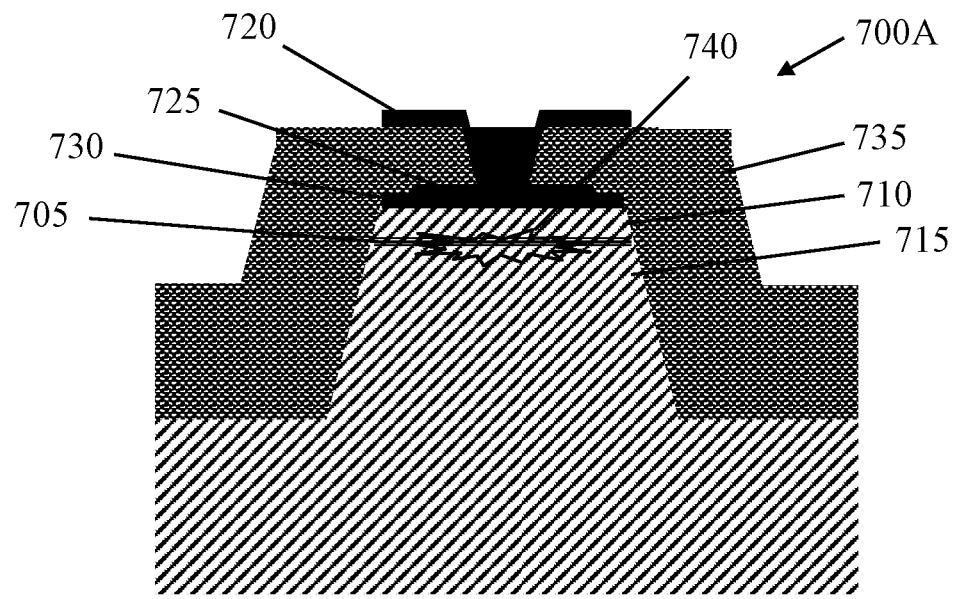
FIG. 7A is a cross-sectional schematic view of an example LED.

FIG. 7A shows a cross-sectional schematic view of an example microLED 700A lacking such field plates. In LED 700A a multi quantum well (MQW) semiconductor structure 705 is sandwiched between a p-type semiconductor layer 710 and an n-type semiconductor layer 715. Electrical contact to the p-layer is made through p-contact pad 720, p-metallization 725, and conductive metal oxide (e.g., Indium Tin Oxide) layer 730. Electrical contact to the n-type layer is made through contacts not shown in the figure. An insulating layer 735 coats perimeter surfaces of the semiconductor layers. The n-type, p-type, and MQW semiconductors may be AlInGaN (e.g., GaN) materials, for example, although any other suitable semiconductor material system may be used instead. The p-metallization acts as a reflector in addition to an electrical contact. Light is emitted from the device through the n-type layer (in the downward direction in the figure).

In operation of LED 700A electrons (e⁻) are injected from the n-type semiconductor layer into the MQW structure, holes (h+) are injected from the p-type semiconductor into the MQW structure, and some of the electrons and holes radiatively recombine in the MQW structure to emit light 740. Because non-radiative recombination quenches light emission in portions of the MQW near perimeter surfaces of the semiconductor layer, in the device of FIG. 7A light 740 is shown as emitted only from regions of the MQW located away from the perimeter surfaces.

Figure 7B:
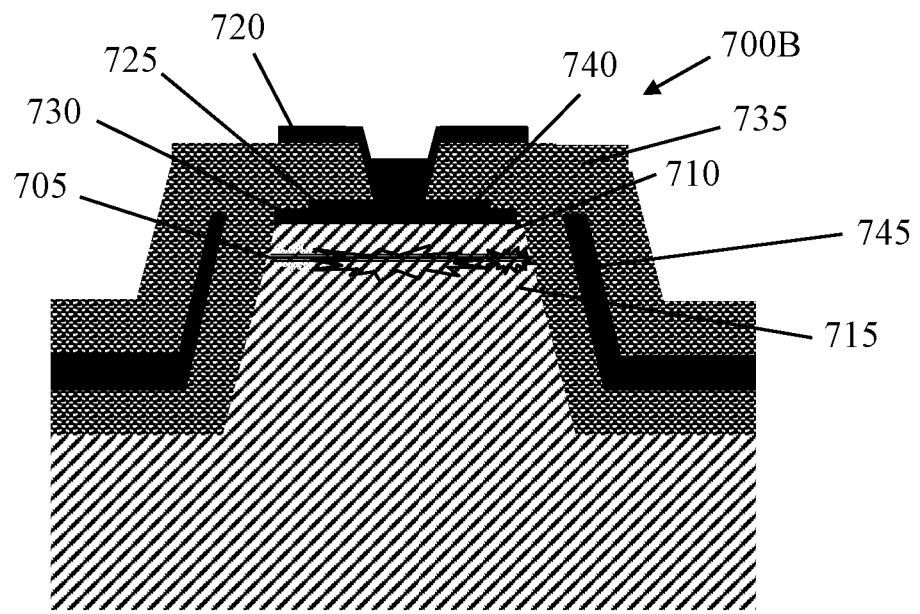
FIG. 7B is a cross-sectional schematic view of an example LED as in FIG. 7A, but further including field plates.

MicroLED 700B depicted in FIG. 7B is similar or identical to LED 700A, except for further comprising field plates 745. In operation of LED 700B a bias voltage is applied to field plates 745 to reduce the population of carriers (electrons or holes) near the perimeter surfaces of the semiconductor layers. As explained above, this reduces non-radiative recombination near those surfaces. FIG. 7B thus schematically shows light 740 being emitted in the MQW structure near those perimeter surfaces as well as in the regions shown emitting light in LED 700A of FIG. 7A.

Figure 8A:
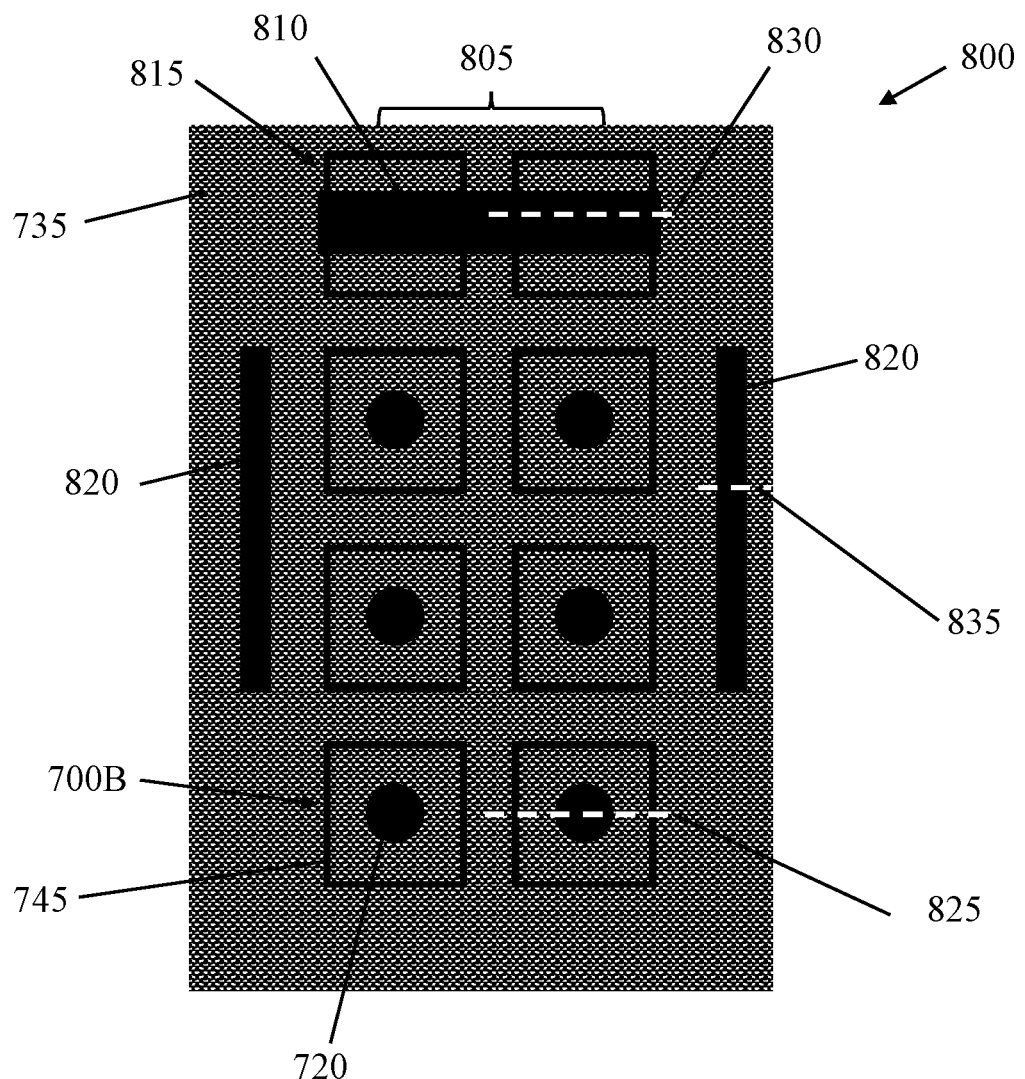
FIG. 8A is a top schematic view of an example monolithic microLED array comprising field plates.

FIG. 8A shows a top schematic view of an example monolithic microLED array 800 comprising field plates. In the illustrated example array 800 comprises six active microLEDs 700B, but such an array may include any other suitable number of microLEDs arranged in any suitable manner. In the illustrated example the perimeter of each microLED is surrounded by a field plate 745, and the field plates are electrically connected to each other. A bias voltage may be applied to field plates 745 through common field plate contact 805, which comprises a metal field plate contact pad 810 in electrical contact with field plates 745 on inactive microLED mesa structures 815. The n-type semiconductor layers of microLEDs 700B are either common to (shared by) some or all of the microLEDs in the array, or otherwise electrically connected to each other. Array 800 comprises common n-contacts 820, by which electrical contact may be made to the n-type semiconductor layers.

Figure 8B:
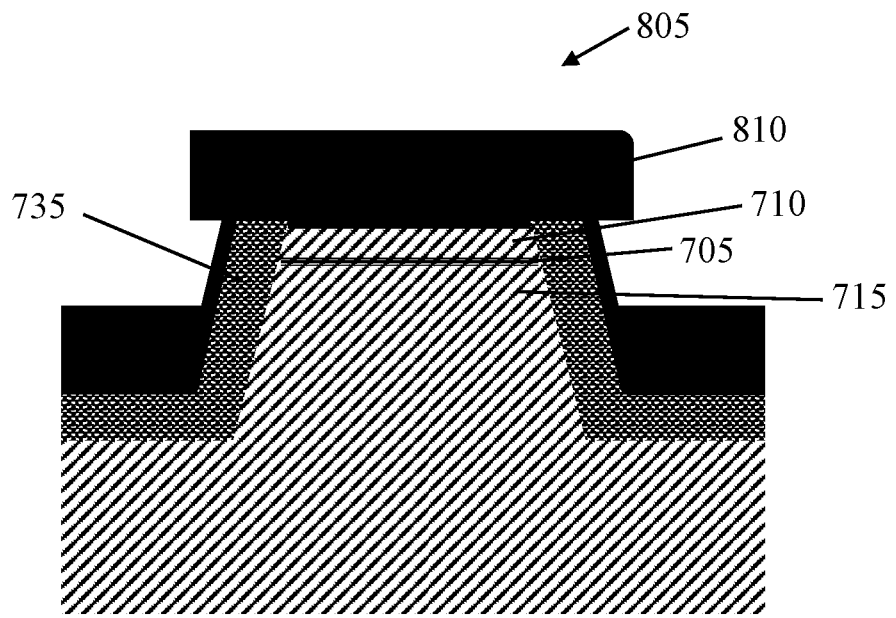
FIG. 8B is a cross-sectional schematic view of a field plate contact pad in the LED array of FIG. 8A.
Figure 8C:
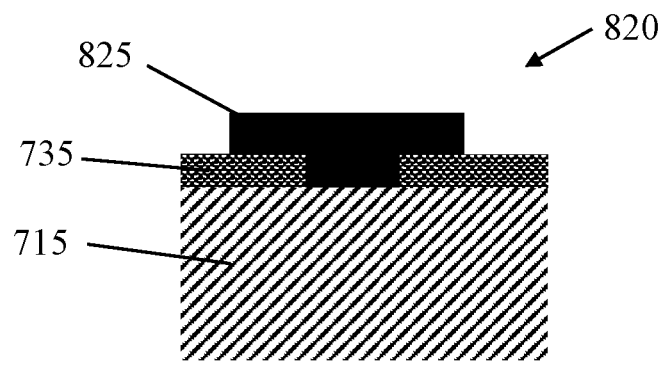
FIG. 8C is a cross-sectional schematic view of common n-contact pad in the LED array of FIG. 8A.

The cross-sectional view of LED 700B shown in FIG. 7B may be taken along cut line 825 shown in FIG. 8A. FIG. 8B shows a cross-sectional view of field plate contact 805 taken along cut line 830 shown in FIG. 8A. FIG. 8C shows a cross-sectional view of common n-contact 820 taken along cut line 835 shown in FIG. 8A. N-contact 820 comprises n-contact pad 825 disposed on n-type layer 715.

Although microLED array 800 is described and depicted as comprising common electrically connected field plates, in other variations one or more of the LEDs (e.g., microLEDs) in an array may comprise a field plate that can be individually addressed and thus held at a bias voltage different from that on field plates in other LEDs in the array.

Field plates 745 may be formed from any suitable metal or other conductive material. For example, field plates 745 may be formed from or comprise Pt, TiN, TiW, TaN, copper, aluminum, and/or silver. Field plates 745 may be reflective to light emitted by the LED, and thus also function as side wall reflectors for the LED. Insulating layer 735 may be formed from SiNx, SiOx, AlOx, or combinations thereof, for example. The thickness of insulating layer 735 between field plates 745 and the MQW semiconductor layers may be about 10 nm to about 500 nm, for example. Field plates 745 may have a thickness of, for example, about 10 nm to about 1 um.

Each LED comprising field plates as described above has an n-contact, a p-contact, and a field plate contact and is therefore a three (or more)-terminal device.

A positive voltage with respect to ground applied to the field plate depletes the population of holes in the MQW structure near the semiconductor perimeter surfaces (e.g., near the MQW/insulating layer 735 interface). A negative voltage with respect to ground applied to the field plate depletes the population of electrons in the MQW structure near the semiconductor perimeter surfaces. Generally, the optimal voltage applied to the field plates depends on the dielectric constant of the insulating material layer and the thickness of the insulating material layer between the field plate and the MQW structure. Suitable bias voltages for the field plates may for example lie in the rang of −5 Volts to +5 Volts with respect to ground. In the illustrated example devices, the n-type semiconductor layer may be at ground. Alternatively, the n-type semiconductor layer may have negative bias, for example a negative bias of −2 V. The bias on the field plate may be chosen, for example, to deplete the MQW structure of carriers to a depth of greater than or equal to about 20 nanometers, greater than or equal to about 30 nanometers, or about 20 nanometers to about 30 nanometers from the perimeter surface of the MQW layer.

If the field plates for the LEDs in an array are individually addressable, they may be biased at voltages that separately optimize the performance of each LED, or that minimize the variation in performance between the separate LEDs in the array, or that maximize the light output from the array, or according to any other suitable figure of merit. If the field plates for the separate LEDs are electrically coupled and biased at a common voltage, the field plate bias voltage may be chosen to minimize the variation in performance between the LEDs in the array, or to optimize the total light output from the LED array, or according to some other suitable figure of merit.

Figure 9:
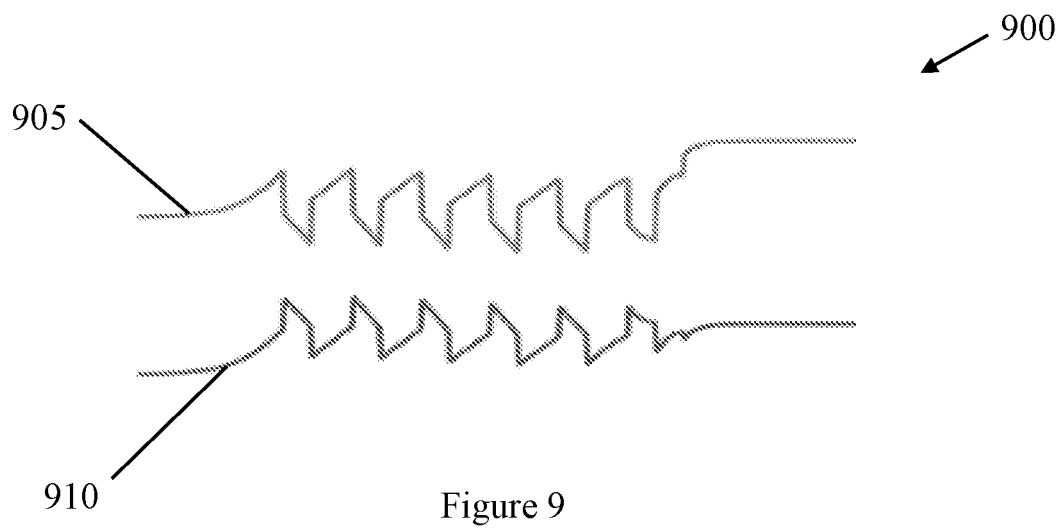
FIG. 9 schematically depicts an example band diagram for a multi quantum well (MQW) structure in an LED.

FIG. 9 schematically depicts a conduction band edge 905 and a valence band edge 910 in an example band diagram 900 for a portion of a MQW structure in an LED away from the perimeter surfaces of the semiconductor structure. Near the perimeter surfaces (not shown) the bandgap between the conduction and valence band edges may be populated with surface states enabling non-radiative recombination.

Figure 10:
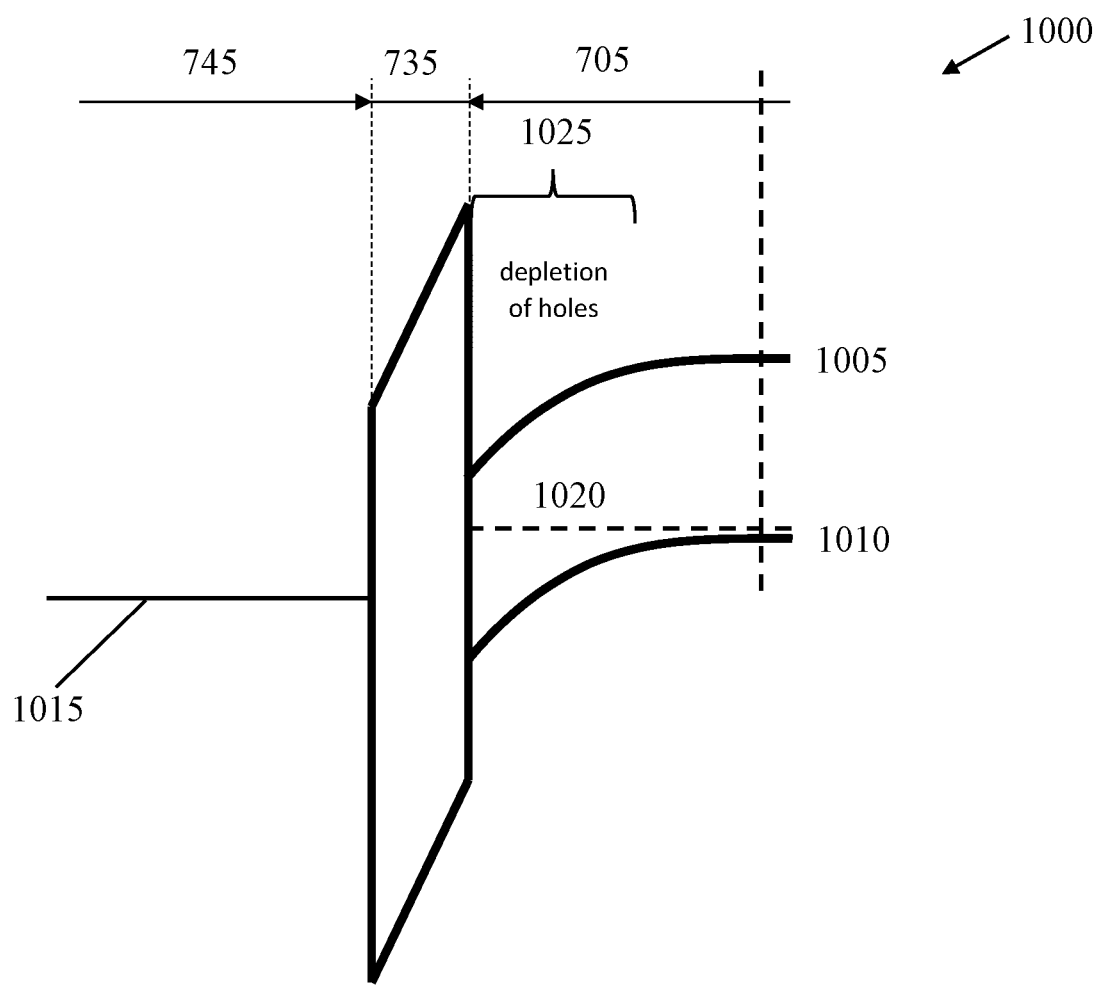
FIG. 10 schematically depicts a band diagram for a portion of an example LED comprising a field plate as described herein, including the depletion of holes near a perimeter semiconductor surface of the LED induced by a positive potential applied to the field plate.

FIG. 10 schematically depicts a conduction band edge 1005 and a valence band edge 1010 for a portion of an example band diagram 1000 for a MQW structure 705 in an LED comprising a metal field plate 745 separated from the MQW by an insulating layer 735, as described above. The Fermi level 1015 in the metal and the Fermi level 1020 in the MQW are also shown. This band diagram is altered compared to that shown in FIG. 9A due to interface boundary conditions. In addition, in this band diagram an applied positive potential at metal field plate 745 causes depletion of holes in region 1025 near the semiconductor surface edge. The lack of holes prevents electron—hole recombination (both radiative and non-radiative) from happening in the MQW structure in this region. The depletion region width is large enough to avoid tunneling currents.

Figure 11:
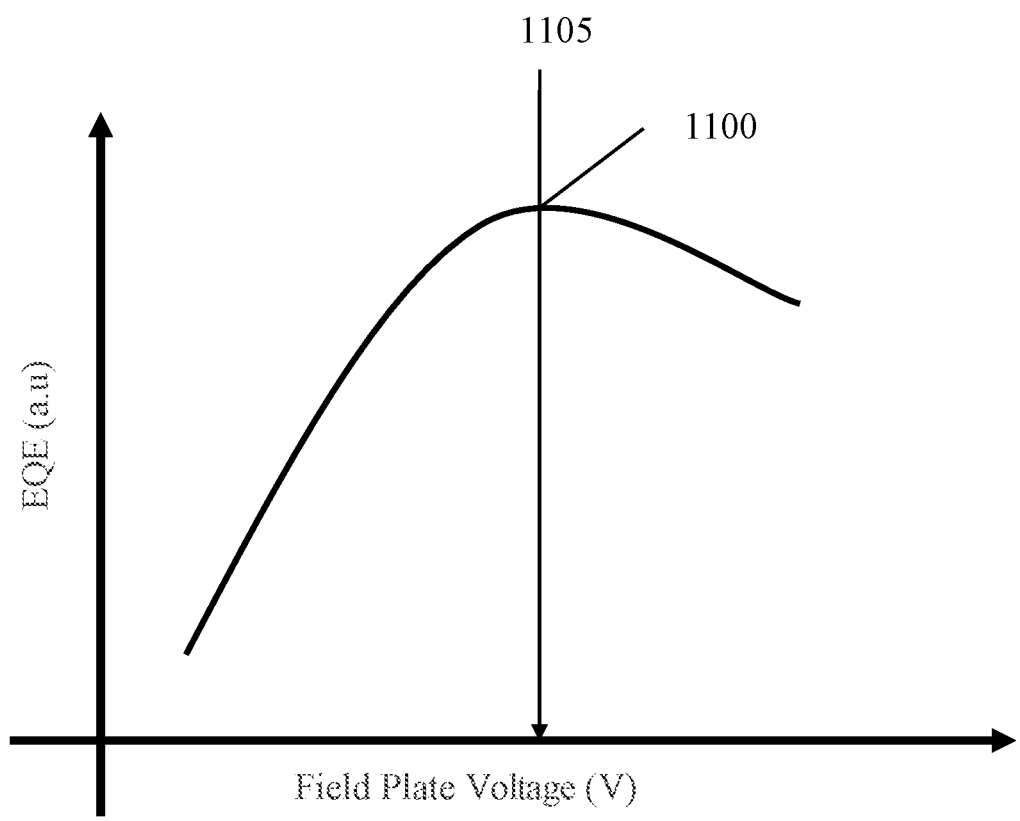
FIG. 11 shows a plot of external quantum efficiency (EQE) against field plate voltage for an LED device comprising field plates as described herein.

FIG. 11 shows a plot of external quantum efficiency (EQE) against field plate voltage for an LED device comprising field plates as described herein. As the field plate voltage is increased, a hole depletion region (e.g., region 1025 in FIG. 10) near the MQW perimeter is created that reduces non-radiative recombination and thus increases EQE as described above. As the field plate voltage is further increased, the depletion region penetrates further into the MQW structure and reduces the active area in which radiative recombination occurs. At sufficiently high bias voltage this begins to reduce the EQE. Hence the plot exhibits a maximum EQE 1100 corresponding to a maximizing field plate voltage 1105

This disclosure is illustrative and not limiting. Further modifications will be apparent to one skilled in the art in light of this disclosure and are intended to fall within the scope of the appended claims.

What is claimed is:

1. A light emitting diode comprising:
   a semiconductor diode structure comprising an active layer disposed between an n-type layer and a p-type layer, a top surface formed by either the n-type layer or the p-type layer, a bottom surface oppositely positioned from the top surface and formed by the other of the n-type layer or the p-type layer not forming the top surface, and side surfaces connecting the top and bottom surfaces, the active layer configured to emit light upon application of a forward bias across the semiconductor diode structure;
   a field plate arranged along one or more of the side surfaces of the semiconductor diode structure to apply an electric field to a perimeter region of the active layer adjacent the one or more side surfaces, the field plate spaced apart from the one or more side surfaces of the semiconductor diode structure by an insulating layer;

an electrical contact to the n-type layer, an electrical contact to the p-type layer; and an electrical contact to the field plate.

2. The light emitting diode of claim 1, wherein the semiconductor diode structure has a largest dimension in a plane parallel to and passing through the active layer of less than or equal to 50 microns.

3. The light emitting diode of claim 1, wherein the field plate is arranged along the side surfaces of the semiconductor diode structure to surround the semiconductor diode structure in a plane parallel to and passing through the active layer.

4. The light emitting diode of claim 1, wherein the field plate is spaced apart from the one or more side surfaces by a distance of about 10 nm to about 50 nm by the insulating layer.

5. The light emitting diode of claim 4, wherein the insulating layer has a dielectric constant of about 2.0 to about 16.

6. The light emitting diode of claim 1, wherein the field plate is formed from a metal.

7. The light emitting diode of claim 1, wherein the field plate is reflective to light emitted by the active layer and incident on the field plate through the insulating layer.

8. The light emitting diode of claim 1, wherein:
the semiconductor diode structure has a largest dimension in a plane parallel to and passing through the active layer of less than or equal to 50 microns; and
the field plate is arranged along the side surfaces of the semiconductor diode structure to surround the semiconductor diode structure in a plane parallel to and passing through the active layer.

9. A method of operating the light emitting diode of claim 1, the method comprising applying a bias voltage to the field plate to deplete the perimeter region of the active layer of charge carriers.

10. The method of claim 9, comprising applying a bias voltage to the field plate to maximize a quantum efficiency with which the active layer emits light.

11. The method of claim 9, comprising applying a positive bias voltage to the field plate to deplete the perimeter region of the active layer of holes.

12. The method of claim 9, comprising applying a negative bias voltage to the field plate to deplete the perimeter region of the active layer of electrons.

13. A light emitting diode array comprising:
two or more light emitting diodes, each light emitting diode comprising:
a semiconductor diode structure comprising an active layer disposed between an n-type layer and a p-type layer, a top surface formed by the p-type layer, a bottom surface oppositely positioned from the top surface and formed by the n-type layer, and side surfaces connecting the top and bottom surfaces, the active layer configured to emit light upon application of a forward bias across the semiconductor diode structure; and
a field plate arranged along one or more of the side surfaces of the semiconductor diode structure to apply an electric field to a perimeter region of the active layer adjacent the one or more side surfaces, the field plate spaced apart from the one or more side surfaces of the semiconductor diode structure by an insulating layer;

an electrical contact to the n-type layer in each of the two more light emitting diodes;

an electrical contact to the p-type layer in each of the two or more light emitting diodes; and an electrical contact to the field plates in the two or more light emitting diodes.

14. The light emitting diode array of claim 13, wherein the two or more light emitting diodes are portions of a monolithic semiconductor structure.

15. The light emitting diode array of claim 13, wherein the two or more light emitting diodes are microLEDs.

16. The light emitting diode array of claim 13, comprising an electrical contact common to the field plates in the two or more light emitting diodes by which the field plates may be biased at a common voltage.

17. The light emitting diode array of claim 13, comprising separate electrical contacts to the field plates in the two or more light emitting diodes by which the field plates in the two or more light emitting diodes may be biased at different voltages.

18. A method of operating the light emitting diode of claim 13 comprising biasing the field plates of the two or more light emitting diodes at a same bias voltage.

19. A method of operating the light emitting diode of claim 13 comprising biasing the field plates of the two or more light emitting diodes at different bias voltages.

20. A display system comprising:
the light emitting diode array of claim 13;
a display; and
an optic or optical system spaced apart from the light emitting diode array and arranged to couple light from the light emitting diode array into the display.

21. A mobile device comprising:
a camera; and
a flash illumination system comprising:
the light emitting diode array of claim 13; and
an optic or optical system spaced apart from the light emitting diode array and arranged to direct light emitted by the light emitting diode array into a field of view of the camera.

22. An illumination system comprising:
the light emitting diode array of claim 13; and
an optic or optical system spaced apart from the light emitting diode array and arranged to form an illumination beam from light emitted by the light emitting diode array.

* * * * *